United States Patent [19]
Shirai et al.

[11] Patent Number: 5,709,338
[45] Date of Patent: Jan. 20, 1998

[54] SOLDERING METHOD

[75] Inventors: Mitugu Shirai; Hideaki Sasaki; Takeshi Takahashi, all of Hadano, Japan

[73] Assignee: Hitachi, Ltd., Tokyo, Japan

[21] Appl. No.: 636,186

[22] Filed: Apr. 22, 1996

[30] Foreign Application Priority Data

Apr. 24, 1995 [JP] Japan ................................. 7-098637

[51] Int. Cl.⁶ ........................... B23K 1/19; B23K 35/14; B23K 35/24
[52] U.S. Cl. ........................... 228/226; 228/233.2
[58] Field of Search .................. 228/226, 225, 228/233.2, 246

[56] References Cited

U.S. PATENT DOCUMENTS 5,540,379   7/1996   Kazem-Goudarzi et al. ........ 228/233.2

FOREIGN PATENT DOCUMENTS 4-360557   12/1992   Japan .
93/02831    2/1993   WIPO ................................. 228/246

*Primary Examiner*—P. Austin Bradley
*Assistant Examiner*—Jeffrey T. Knapp
*Attorney, Agent, or Firm*—Fay, Sharpe, Beall, Fagan, Minnich & McKee

[57] ABSTRACT

A soldering is performed in such a manner that two solder portions having different melting points are put between a metallization on a substrate for joining and a part. The chip portion having a higher melting point is made thicker than a solder foil portion having a lower melting point. Initially, the part is held to the metallization by the solder chip having the higher melting point. The solder foil having the lower melting point is first melted in such a state and, after that, the solder chip having the higher melting point is melted. By such a soldering method, a reliable soldering can be performed, without causing a void on the undersurface of a part joint section, by one soldering operation, so that a presoldering operation becomes unnecessary.

7 Claims, 2 Drawing Sheets

SOLDERING METHOD

BACKGROUND OF THE INVENTION

The present invention relates to a method of soldering electronic parts and the like and, more particularly, to a soldering method such that electronic parts and the like can be excellently jointed onto a resin board, a ceramic board, or the like constructing a printed circuit board by a soldering.

In case of soldering parts onto a printed circuit board, it is preferred that there is no defect such as a void or the like in a solder joint for connection. When the soldering is performed for the purpose of not only an electrical joint and mechanical strength but also holding of gastightness, for example, when He gas is flowed for heat dissipation of a printed circuit board and the soldering is performed with the intention of holding of gastightness so as to prevent dissipation of the He gas, it is important for reliable joint to prevent a void which occurs during the soldering and soldering methods which prevent the occurrence of the void have been conventionally considered. In a soldered joint with little void defect, the mechanical strength is also improved, so that it is preferred in this point of view as well.

FIGS. 2a and 2b are diagrams for explaining a conventional soldering method. In FIGS. 2a, 2b, 3a, 3b, 3c, and 3d, reference numeral 1 denotes a printed circuit board; 2 a metallization for joining by soldering on a board side; 3 a solder foil; 4 a metallization for joining by soldering on a part side; 5 a part; 6 a melted joint solder; 7 a void; and 9 a joint solder solidified from a melted state.

According to a soldering method shown in FIGS. 2a and 2b, a soldering is performed in a manner such that the solder foil 3 is sandwitched between the metallization 2 for joining by soldering on the printed circuit board 1 side and the metallization 4 for joining by soldering on the part 5 side as shown in FIG. 2a and is heated. Although a flux is often used for the soldering, it is not always necessary. The solder foil 3 is melted by the heating and the part 5 is joined onto the printed circuit board 1 as shown in FIG. 2b which shows a state after the soldering operation. The void 7 is formed in the joint solder 9 for jointing the printed circuit board 1 and the part 5.

The void is formed in a manner such that air caught when the melted solder is moved or gas which occurs from the flux during the soldering is covered by the part 5 and remains.

FIGS. 3a, 3b, 3c, and 3d are diagrams for explaining another example of a conventional soldering method. Portions similar to those in FIGS. 2a and 2b are designated by the same reference numerals in FIGS. 3a, 3b, 3c and 3d. According to the conventional technique, occurrence of the void in the conventional technique described with reference to FIGS. 2a and 2b can be prevented.

According to the method shown in FIGS. 3a, 3b, 3c, and 3d, the solder foil 3 is put on the metallization 2 for joining by soldering on the printed circuit board 1 as shown in FIG. 3a and, in such a state, the solder foil 3 and a flux, if necessary, are heated once and as shown in FIG. 3b, the solder foil 3 is heated and melted. Although air is caught when the solder flows and gas occurs from the flux by the heating operation, since there is no part above the melted joint solder 6, a light gas component having small density can be easily escaped from the solder and no void remains in the joint solder 6 as shown in FIG. 3b.

After performing such a process (called "presoldering"), the part 5 is set on the solidified joint solder 6 as shown in FIG. 3c and the heating is again performed together with the flux, if necessary. Consequently, the joint solder 6 is again heated and melted, thereby enabling the printed circuit board 1 and the part 5 to be joined without the void between the metallization patterns 2 and 4.

When the part 5 is set and the joint solder 6 is again melted, gas may occur from the flux. The soldering surface of the metallization 4 of the part 5 is usually small and the gas in the melted solder can easily escape, so that the void hardly remains.

As a conventional technique of a soldering in which the presoldering is performed, for example, a technique disclosed in Japanese Patent Application Laid-Open No. 4-360557 or the like is known.

According to the above-mentioned conventional technique in which the presoldering is performed, in order to obtain a solder joint for connection without the void which occurs during the soldering, it is necessary to set the part to be connected and to melt the solder again after the solder is melted once by the presoldering operation. In the conventional technique, consequently, there are problems such that two heating processes and further a cleaning operation are necessary, so that a long operation time, and soldering apparatus of the number which is twice as many as the number necessary for the foregoing conventional technique are necessary to joint one part. The conventional technique also has a problem such that the printed circuit board and the like is requested to have heat resistance.

SUMMARY OF THE INVENTION

It is an object of the present invention to solve the above-mentioned problems of the conventional technique and to provide a soldering method, in which occurrence of a void is prevented, of only one heating operation and a reliable soldering can be performed.

According to the present invention, the object is accomplished by a soldering method in which solder material which are not melted and a flux if necessary are supplied to facing joint surfaces of two members to be connected and, after that, the solder material are melted by a heating and a joining operation with a solder is executed, comprising the steps of: supplying at least two kinds of solder material having different height and different melting points to the joint surfaces; keeping an interval of the members to be jointed at a predetermined distance by the solder material having a higher melting point; holding both of the members so that there is a gap of a predetermined distance between the solder material having a lower melting point and one of the members; and melting only the solder material having the lower melting point and, after that, elevating the temperature and melting the solder material having the higher melting point.

Two kinds of solder material having different height and different melting points are supplied to the metallizations for joining as facing joint surfaces of the two members to be connected. The taller solder material having the higher melting point has a role to hold the members to be connected at a predetermined interval. When the heating is performed, the shorter solder material having the lower melting point is melted first. Since the surface of the melted solder is not blocked by the member to be connected, so that gas as a cause of the void occurrence can be easily eliminated from the solder. When the heating is continued, the taller solder material having the higher melting point is melted, the distance between the two members is shortened due to the self weight of one of the members, the surface of the upper member contacts the melted solder having no void and the lower melting point, thereby enabling the entire joint surfaces to be joined.

According to the present invention constructed as mentioned above, an effect similar to that of the conventional presoldering method mentioned above can be obtained by one heating step and the reliable soldering in which there is no void defect in a joint can be performed. According to the soldering method of the present invention, the melted solder can be ingeniously degased whether the flux is used or not and it can be prevented that the gas is caught in the solder.

In the present invention, a solidus temperature of the solder material having the lower melting point is set to a value within a range from 130° C. to 330° C. and a solidus temperature of the solder material having the higher melting point is set to a value higher than the solidus temperature of the solder material having the lower melting point by 5° C. or more.

Although preferred combination examples of the solder material having the lower melting point and the solder material having the higher melting point are shown hereinbelow, the invention is not limited to these combinations.

TABLE 1

Combination examples of the solder material having the lower melting point and the solder material having the higher melting point

| No. | Solder material having the lower melting point (wt %) | Solder material having the higher melting point (wt %) |
| --- | --- | --- |
| 1 | 63Sn-37Pb | 96.5Sn-3.5Ag |
| 2 | 63Sn-37 Pb | 5Sn-95Pb |
| 3 | 96.5Sn-3.5Ag | Sn |
| 4 | 18Bi-45Pb-37Sn | 63Sn-37Pb |
| 5 | 18Bi-45Pb-37Sn | 96.5Sn-3.5Ag |

It is necessary that the height of the taller solder material having higher melting point should be so large that the melted shorter solder material having lower melting point does not touch the other member to which the melted solder has not yet adhered when the shorter solder material having lower melting point is melted by heating. The height required by the solder material having the higher melting point can be known by a very simple experiment.

In the soldering method of the present invention as mentioned above, a gap is formed between the solder material having the lower melting point and one of the members which is to be soldered and the gas is allowed to outflow to be eliminated. An area of the front surface of the solder material having the higher melting point, which is in parallel with the melting surface of the solder material having the lower melting point, has to be smaller than the area of the solder material having the lower melting point. When the area of the solder material having the higher melting point is smaller than the area of the solder material having the lower melting point even by a little, a corresponding effect can be obtained. It is more preferable that the former area is equal to or smaller than 1/10 of the latter area and that the ratio is as small as possible so long as both of the members to be soldered can be held at a predetermined interval. For this reason, the shape of the solder material having the higher melting point can also be a sphere.

DESCRIPTION OF THE PREFERRED EMBODIMENTS

Figure 1A:
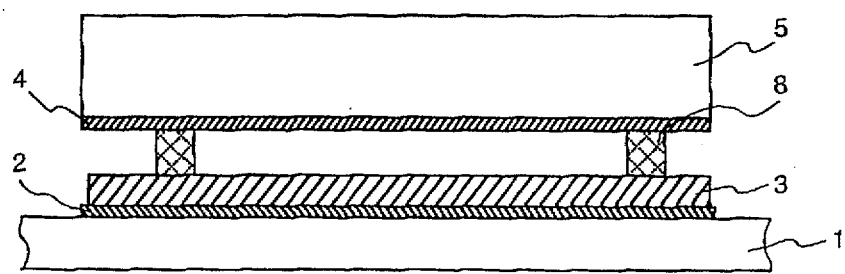
FIGS. 1a, 1b, and 1c are schematic sectional views showing steps of a soldering according to an embodiment of the present invention.
Figure 1B:
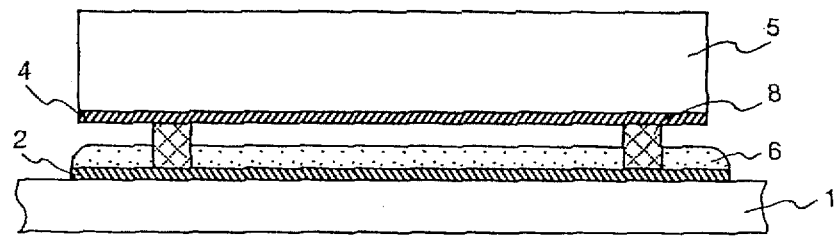
Figure 1C:
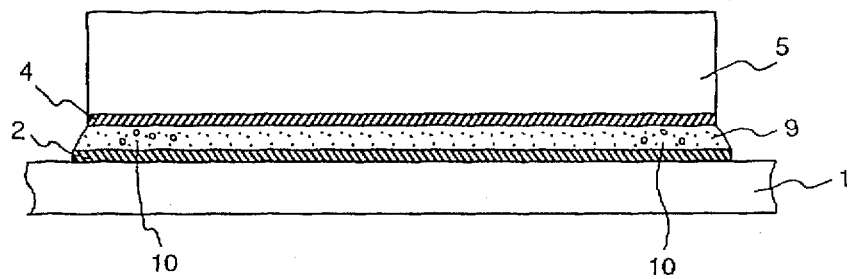
Figure 2A:
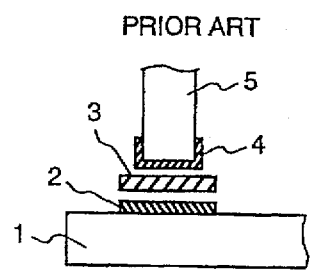
FIGS. 2a and 2b are schematic sectional views showing steps of a conventional soldering.
Figure 2B:
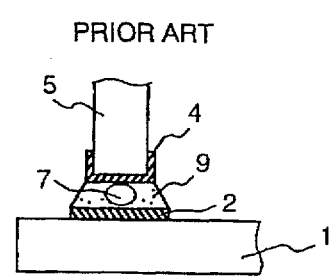
Figure 3A:
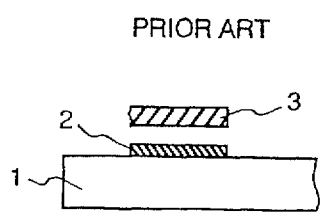
FIGS. 3a, 3b, 3c, and 3d are schematic sectional views showing steps of another conventional soldering.
Figure 3B:
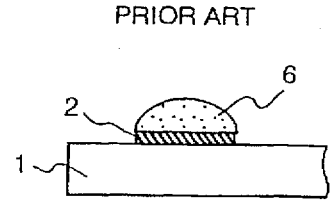
Figure 3C:
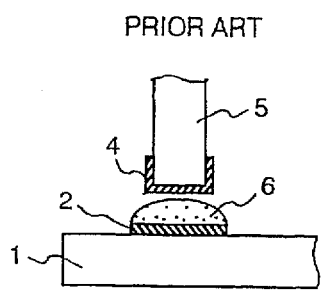
Figure 3D:
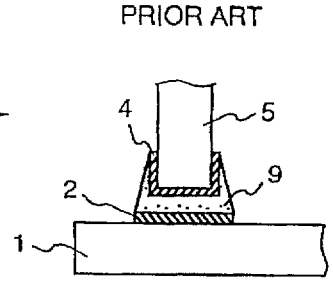

FIGS. 1a, 1b, and 1c are diagrams for explaining a soldering method according to an embodiment of the present invention. In FIGS. 1a and 1b, reference numeral 8 denotes a solder chip and other component elements are designated by the same reference numerals as those in FIGS. 2a, 2b, 3a, 3b, 3c, and 3d.

Two members to be joined by a soldering are the printed circuit board 1 and the part 5 as shown in FIG. 1a. In the part 5, for example, a joint portion for sealing up other parts on the printed circuit board 1 can have a shape such as a rectangle or the like or a joint portion for heat radiation or the like of the board itself can have a linear shape, or the like.

In this case, two kinds of solder materials denote the solder foil 3 and the solder chip 8. The solder foil 3 is lower (thinner) than the solder ship 8 in height (thickness) and the melting point of the solder foil 3 is lower than that of the solder chip 8. That is, the solder chip 8 is composed so as to have the melting point higher than that of the solder foil 3 and is thicker than the solder foil 3.

As shown in FIG. 1a, the solder foil 3 and the solder chip 8 are put on the metallization 2 for joining on the printed circuit board 1 and the part 5 is set on the metallization 2 for joining. The solder chip 8 is placed at least in two places on an entire joint surface and the solder foil 3 is placed on the entire surface including the other portion except the portions of the solder chips 8. As mentioned above, since the solder chip 8 is thicker than the solder foil 3, the part 5 is held by the solder chips 8 above the printed circuit board 1. A rosin system flux is used as a flux. An area of the solder chip 8 for holding the part 5 can be small as compared with the area of the solder foil 3.

In the embodiment, a width of each of the metallizations 2 and 4 for joining is equal to 3 mm, a width of the solder foil 3 is equal to 3 mm, a thickness of the solder foil 3 is equal to 0.3 mm. As a solder chip 8, a wire-shaped solder material having a length of 3 mm and a diameter of 2 mm is used (accordingly, a height of the solder chip 8 is equal to 2 mm).

A heating is started in the above-mentioned state. FIG. 1b shows a state where a heating temperature is held in a range higher than the melting point of the solder foil 3 and lower than the melting point of the solder chip 8. Since a joint as a connecting portion of the printed circuit board 1 and the part 5 is heated to a temperature equal to or higher than the melting point of the solder foil 3, the joint solder 6 is wetted and extended on the metallization 2 for joining on the printed circuit board 1, thereby finishing the connection with the printed circuit board 1. Since the solder chip 8 is not yet melted in such a state, the part 5 is held by the solder chips 8 and does not contact with the joint solder 6. Gas caught when the solder foil 3 is melted and wetted from the state of FIG. 1a or gas which occurs when the solder is melted is easily ejected from the solder in a state shown in FIG. 1b.

When the heating temperature is further elevated from the state mentioned above to the melting point of the solder chip 8 or higher, the solder chip 8 is melted and have no power to hold the part 5. The part 5 is dropped by the self weight and is dipped in the joint solder 6 as shown in FIG. 1c, thereby soldering the part 5 to the printed circuit board 1.

In the present embodiment, a time t since the solder material having the lower melting point is melted until the solder material having the higher melting point is melted is set to 2 minutes. Since gas is ejected from the melted solder during such a period of time, when the time is short, the gas ejection is insufficient, and when it is too long, an operation time becomes unnecessarily long. The time t necessary for sufficient gas ejection and for preventing a void which causes inconvenience can be decided by a simple experiment such that a remaining state of the void is examined by using an X-ray after completion of the soldering and the relation between the time t and the state is checked.

According to the soldering method of the embodiment of the present invention mentioned above, the generated gas can be ejected from the solder during a period of time from the solder foil 3 is melted earlier than the solder chip 8 until the part 5 is contacted to the melted joint solder 6, the reliable soldering in which no void remains in the joint solder can be performed by one heating operation similar to the presoldering method described by the conventional technique.

In the foregoing embodiment of the present invention, it happens that the void slightly remains in the portion corresponding to the place where the solder chip 8 was set. Since the area of the solder chip 8 is extremely small in comparison with the entire area to be joined, there is no influence by the remained void. A void having a diameter equal to or or less than 0.8 mm has little influence.

An optional combination of a material of the solder foil 3 and a material of the solder chip 8 can be selected in a manner such that a difference of solidus temperatures of them is considered and it is also considered that when they are melted, mixed, and solidified, the derived material does not have unpreferable characteristics.

For example, in case of selecting a solder material of a composition of Sn:Pb=63:37 wt % (solidus temperature and liquidus temperature are equal to 183° C.) as a solder foil 3, a solder material of Sn:Ag=96.5:3.5 wt % (solidus temperature and liquidus temperature are equal to 221° C.) can be selected as a solder chip 8.

In this case, temperature control in the soldering method according to the embodiment of the present invention is performed in a manner such that a heating operation is performed from a room temperature and the temperature is once held in a range from 190° C. to 200° C. to melt the solder foil 3 and the gas in the solder is eliminated and, after that, the temperature is elevatedd to a range from 240° C. to 250° C. to melt the solder chip 8 and the temperature is lowered after the part 5 is dipped by the self weight in the melted solder.

A lowering speed of the temperature in case of lowering the temperature can be decided in consideration of a repair of the part. That is, when the lowering speed of the temperature is slow, Ag in the melted solder chip 8 diffuses into the solder material of the solder foil 3 and the joint solder 6 solidifies in a state where Ag concentration of a peripheral area 10 of the solder chip 8 is low and Pb concentration is relatively high (namely, in a state where the solidus temperature is low). When the part 5 is intended to be removed later, the part 5 can be repaired at a relatively low heating temperature (a temperature equal to or higher than the melting point temperature of the solder foil 3). When the lowering speed of the temperature is fast, Ag in the melted solder chip 8 is only slightly diffused into the solder material of the solder foil 3 and the joint solder 6 solidifies in a state where the Ag concentration of the peripheral area 10 of the solder chip 8 is high and the Pb concentration is low (that is, a state where the solidus temperature is high). When the part 5 is intended to be removed later, the part 5 cannot be repaired until it is heated to a high temperature (a temperature equal to or higher than the melting point temperature of the solder chip 8).

In a manner similar to the above, when a solder material of a composition of Sn: Pb=63:37 wt % is selected as a solder foil 3, a solder material of Sn:Pb=5:95 wt % (the solidus temperature is equal to 302° C. and the liquidus temperature is equal to 314° C.) can be selected as a solder chip 8.

In this case as well, the temperature is elevated to a range from 190° C. to 200° C. to melt the solder foil 3 and, after that, the temperature is further elevated to a range from 330° C. to 350° C. to melt the solder chip 8 of the composition of Sn:Pb=5:95 wt %, thereby performing the soldering.

In this case as well, Pb in the solder chip 8 of the composition of Sn: Pb=5:95 wt % is melted and diffused into the joint solder 6 which is the melted solder foil of Sn: Pb=63:37 wt %. The Pb concentration in the peripheral area of the chip can be controlled by the lowering speed of the temperature, that is, the melting time in a manner similar to the above.

Although the foregoing embodiment of the present invention has been described by using the foil as a supply format of the solder material, the present invention is not limited to the foil. A solder paste, a solder wire, and the like can be also supplied as a solder material having a low melting point. A solder wire can be also used as a solder material having a high melting point.

As will be obviously understood from the foregoing embodiment of the present invention, when a substrate member such as a printed circuit board and a part are soldered, the soldering conventionally performed twice to prevent the void occurring under the part can be performed by one heating operation, so that an operation time necessary for the soldering is shortened, a load of heating equipment is reduced, and costs for investment in equipment and installation space can be saved.

According to the present invention as mentioned above, when two members are soldered, the occurrence of the void in the joint solder is prevented by only one heating operation and a reliable soldering can be performed.

What is claimed is:

1. A soldering method comprising the steps of: supplying at least two solder portions, each portion having a height corresponding to the melting point of said each portion between said joint surfaces, wherein the highest solder portion has the highest melting point; keeping an interval of the members to be joined at a predetermined distance by said solder portion having the highest melting point; holding both of the members so that there is a gap of a predetermined distance between at least one solder portion having a lower melting point and one of the members; and melting said at least one solder portion having a lower melting point and, thereafter, melting the solder portion having the highest melting point, thereby joining the two members.

2. A method according to claim 1, wherein said at least one solder portion having a lower melting point has a solder composition of Sn—Pb system and said solder portion having the highest melting point has a solder composition of Sn—Ag system or a solder composition of Sn—Pb system in which Pb concentration is higher than that of said at least one solder portion having a lower melting point.

3. A method according to claim 1, wherein said at least one solder portion having a lower melting point is comprise of a Bi—Pb—Sn system alloy and said solder material having the higher melting point is an Sn—Pb system alloy or an Sn—Ag system alloy.

4. A method according to claim 1, wherein said solder portion having the highest melting point is supplied to at least two positions on the joint surfaces of the two members.

5. A method according to claim 4, wherein said at least one solder portion having a lower melting point has a solder composition of Sn—Pb system and said solder material having the highest melting point has a solder composition comprised of Sn—Ag system or a solder composition comprised of Sn—Pb system in which Pb concentration is higher than that of said at least one solder portion having a lower melting point.

6. A method according to claim 1, wherein a solidus temperature of said at least one solder portion having a lower melting point lies within a range from 130° C. to 330° C.

7. A method according to claim 6, wherein said solidus temperature of said solder material having the higher melting point is highest than the solidus temperature of said at least one solder portion having a lower melting point by 5° C. or more.

* * * * *